United States Patent [19]
Akimoto

[11] Patent Number: 5,639,309
[45] Date of Patent: Jun. 17, 1997

[54] PLASMA PROCESSING APPARATUS ADJUSTED FOR A BATCH-PROCESSING OF A PLURALITY OF WAFERS WITH PLASMA GASES

[75] Inventor: Takeshi Akimoto, Tokyo, Japan

[73] Assignee: NEC Corporation, Tokyo, Japan

[21] Appl. No.: 616,212

[22] Filed: Mar. 15, 1996

[30] Foreign Application Priority Data

Mar. 17, 1995 [JP] Japan .................................. 7-057848

[51] Int. Cl.⁶ .................................................. C23C 16/00
[52] U.S. Cl. ........................... 118/723 MP; 118/723 MN; 118/723 E
[58] Field of Search .................... 118/723 MW, 118/723 MP, 723 MA, 723 MR, 723 ME, 723 E, 723 ER; 156/345; 204/298.38

[56] References Cited

U.S. PATENT DOCUMENTS

| | | | |
|---|---|---|---|
| 5,124,014 | 6/1992 | Foo et al. | 204/192.32 |
| 5,202,095 | 4/1993 | Houchin et al. | 422/186 |
| 5,359,177 | 10/1994 | Taki et al. | 219/121.43 |
| 5,415,719 | 5/1995 | Akimoto | 156/345 |
| 5,425,842 | 6/1995 | Zijlstra | 156/643.1 |
| 5,464,476 | 11/1995 | Gibb et al. | 118/723 MP |
| 5,529,632 | 6/1996 | Katayama et al. | 118/723 MP |

FOREIGN PATENT DOCUMENTS

405144773  6/1993  Japan .................................. 204/298.38

*Primary Examiner*—R. Bruce Breneman
*Assistant Examiner*—Joni Y. Chang
*Attorney, Agent, or Firm*—Young & Thompson

[57] ABSTRACT

The present invention provides an apparatus for a batch processing of a plurality of substrates at a time with plasma gas. The above chamber comprises the following elements. A chamber is provided for a batch processing of a plurality of substrates at a time with plasma gas. A plurality of sampling stages are accommodated within the chamber. The sampling stages are spaced apart from each other. Bottom electrodes are provided on the plurality of sampling stages. The bottom electrodes are spaced apart from each other so that substrates are placed on the bottom electrodes. The same number of top electrodes, as the bottom electrodes, are provided over a space which is positioned over the substrates. The top electrodes are positioned to make pairs with the bottom electrodes so that the substrates are positioned between the top and bottom electrodes paired respectively. Each of the top electrodes is divided into a plurality of parts separated from each other by microwave radiation ports through which microwave radiates toward the substrates. A process gas introduction section is provided on the chamber at a level above the substrates and below the top electrodes for introducing a process gas to the space over the substrates. A process gas discharging section is provided on the chamber for discharging the process gas from the chamber. A microwave radiation section is provided over the top electrodes for radiating microwaves toward the substrates via the microwave radiation ports to excite process gasses introduced by the process gas introducing section and generate plasma gases. A high frequency voltage applying section is provided to be electrically connected to at least any of the top and bottom electrodes for applying high frequency voltages between the top and bottom electrodes at high frequencies to accelerate plasma gases for processing the substrates.

55 Claims, 5 Drawing Sheets

PLASMA PROCESSING APPARATUS ADJUSTED FOR A BATCH-PROCESSING OF A PLURALITY OF WAFERS WITH PLASMA GASES

BACKGROUND OF THE INVENTION

The present invention relates to a plasma processing apparatus adjusted for a batch-processing of a plurality of wafers with plasma gases under individually different conditions, and more particularly to a plane parallel plate plasma processing apparatus adjusted for a batch-processing of a plurality of wafers with micro-wave plasma gases under a uniform condition or individually desirable conditions different from each other.

The plasma processing apparatus have widely been used for a plasma chemical vapor deposition and an etching process. In the plasma processing, process gas is excited at a high frequency to generate active plasma gas to be used for a surface processing of a wafer or a substrate. The typical conventional plasma processing apparatus was a single wafer type which is capable of processing a single wafer or substrate at a time. The wafers or substrates to be processed have various sizes. A substrate for a liquid crystal display panel tends to have a large size. In order to improve through put, it is required to install a plurality of the single wafer type plasma processing apparatus. This manner needs not only a high cost but also a large floor space.

In order to settle the above disadvantages, there has been developed a batch plasma processing apparatus which is capable of processing a plurality of wafers with plasma at a time. The batch plasma processing apparatus will be described with reference to FIGS. 1A and 1B. The batch plasma processing apparatus has a chamber 19 which accommodates a plurality of substrates 28 or wafers to be processed. The substrates or wafers are placed on a bottom electrode 21 provided on a sampling stage 23. Plasma gas in the chamber 19 is discharged via a discharge port provided between a bottom portion of the chamber 19 and the sampling stage 23. The bottom electrode 21 is electrically connected to a high frequency power supply 20 which is provided outside the chamber 19. The top portion of the chamber 19 is provided with a plurality of top electrodes 22 provided on a bottom of a ceramic plate. The top electrodes 22 are separated from each other by a plurality of microwave radiation ports 25 through which microwaves are radiated toward the substrates or wafers 28 on the bottom electrode. The outer side face of the top portion of the chamber 19 is provided with a microwave guide 27 for introducing the microwave into the chamber 19. The top portion of the chamber 19 is provided with a dielectric plate 24 made of Teflon for transmitting the microwave from the microwave guide 27 to the microwave radiation ports 25.

Figure 1A:
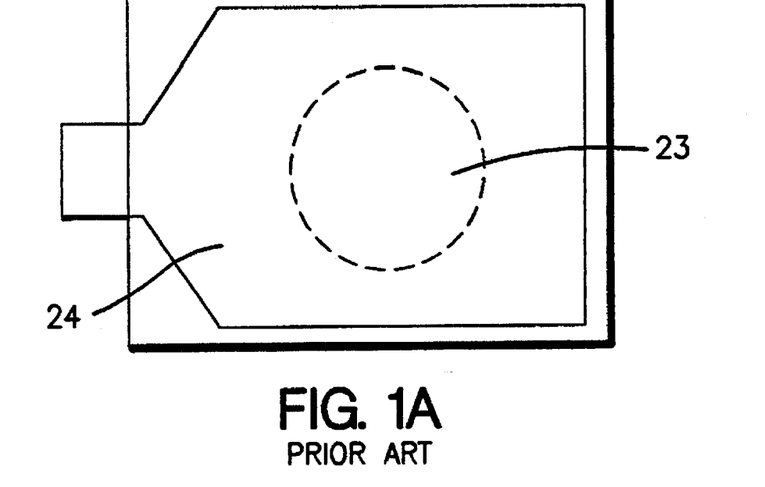
FIG. 1A is a plane view illustrative of the conventional plane parallel plate plasma processing apparatus for batch processing of a plurality of substrates or wafers at one time.
Figure 1B:
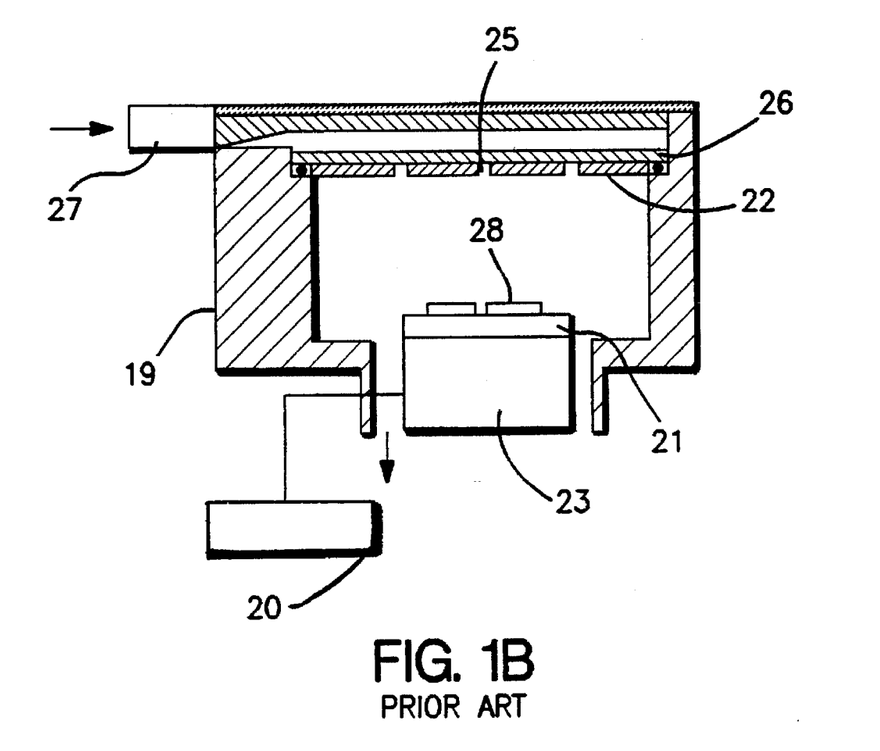
FIG. 1B is a cross sectional elevation view illustrative of the conventional plane parallel plate plasma processing apparatus for batch processing of a plurality of substrates or wafers at one time.

In the above plane parallel plate plasma processing apparatus, the microwave is introduced from the microwave guide through the dielectric plate member 24 and the microwave radiation ports 25 to be radiated toward the substrate or the wafers 28 so that the process gas is excited to generate a plasma gas having a high density. The generated plasma is accelerated by a high frequency electric field generated by a high frequency voltage applied to the bottom electrode 22 for processing the substrates or wafers 28 at a time.

The above plane parallel plate plasma processing apparatus adjusted for the batch processing of the plural wafers or substrates is, however, engaged with the following disadvantages. The microwave radiation ports vary in opening areas between the center and peripheral portions so that the microwave radiated is uniform in intensity. Notwithstanding, the plasma generated by the uniform microwave radiation varies in density. The variation in density of the generated plasma causes a variation in thickness of a CVD film deposited thereby or variations in depth and width of etching thereby.

The above plane parallel plate plasma processing apparatus adjusted for the batch processing of the plural wafers or substrates requires a large chamber like the chamber 19 illustrated in FIGS. 1A and 1B. When a pressure of the process gas in the chamber is reduced to not more than 0.1 Pa or in the vicinity of molecular flow range, then a variation in pressure of the process gas in the chamber 19 over positions is caused. At the position where the pressure is high, the plasma gas tends to include ions which radiates in an oblique direction to the surface of the substrates or the wafers 28. This makes it difficult to obtain a desired aspect ratio of the etching.

In the above circumstances, it has been required to develop a novel plane parallel plate plasma processing apparatus adjusted for a batch processing of a plurality of substrates and wafers under individually different conditions for process gas pressure and intensity of microwave radiation as well as high frequency voltage to thereby allow desirable plasma processing of a plurality of substrates and wafers at one time.

SUMMARY OF THE INVENTION

Accordingly, it is an object of the present invention to provide a novel plasma processing apparatus free from the above disadvantages and problems.

It is a further object of the present invention to provide a novel plane parallel plate plasma processing apparatus adjusted for a batch processing of a plurality of various substrates or wafers at a time under individually different conditions.

It is a still further object of the present invention to provide a novel plane parallel plate plasma processing apparatus adjusted for a batch processing of a plurality of substrates or wafers at a time under a process gas pressure precisely controlled.

It is yet a further object of the present invention to provide a novel plane parallel plate plasma processing apparatus adjusted for a batch processing of a plurality of substrates or wafers at a time under an intensity of microwave radiation precisely controlled.

It is a furthermore object of the present invention to provide a novel plane parallel plate plasma processing apparatus adjusted for a batch processing of a plurality of substrates or wafers at a time under a high frequency power precisely controlled.

It is a furthermore object of the present invention to provide a novel plane parallel plate plasma processing apparatus adjusted for a batch processing of a plurality of substrates or wafers at a time to form uniformly processed substrates or wafers.

The above and other objects, features and advantages of the present invention will be apparent from the following descriptions.

The present invention provides an apparatus for a batch processing of a plurality of substrates at a time with plasma gas. The above chamber comprises the following elements. A chamber is provided for a batch processing of a plurality of substrates at a time with plasma gas. A plurality of sampling stages are accommodated within the chamber. The sampling stages are spaced apart from each other. Bottom electrodes are provided on the plurality of sampling stages. The bottom electrodes are spaced apart from each other so that substrates are placed on the bottom electrodes. The same number of top electrodes, as the bottom electrodes, are provided over a space which is positioned over the substrates. The top electrodes are positioned to make pairs with the bottom electrodes so that the substrates are positioned between the top and bottom electrodes paired respectively. Each of the top electrodes is divided into a plurality of parts separated from each other by microwave radiation ports through which microwave radiates toward the substrates. A process gas introduction section is provided on the chamber at a level above the substrates and below the top electrodes for introducing a process gas to the space over the substrates. A process gas discharging section is provided on the chamber for discharging the process gas from the chamber. A microwave radiation section is provided over the top electrodes for radiating microwaves toward the substrates via the microwave radiation ports to excite process gasses introduced by the process gas introducing section and generate plasma gases. A high frequency voltage applying section is provided to be electrically connected to at least any of the top and bottom electrodes for applying high frequency voltages between the top and bottom electrodes at high frequencies to accelerate plasma gases for processing the substrates.

The present invention also provides another apparatus for a batch processing of a plurality of substrates at a time with plasma gas. The apparatus comprises the following elements. A chamber is provided for a batch processing of a plurality of substrates at a time with plasma gas. A plurality of sampling stages are accommodated within the chamber. The sampling stages are spaced apart from each other. Bottom electrodes are provided on the plurality of sampling stages. The bottom electrodes are spaced apart from each other so that substrates are placed on the bottom electrodes. The same number of top electrodes, as the bottom electrodes, are provided over a space which is positioned over the substrates. The top electrodes are positioned to make pairs with the bottom electrodes so that the substrates are positioned between the top and bottom electrodes paired respectively. Each of the top electrodes is divided into a plurality of parts separated from each other by microwave radiation ports through which microwave radiates toward the substrates. The microwave radiation ports vary in opening area over positions so that intensity of microwave radiation is uniform over positions. The same number of sets of gas introduction ports are provided on the chamber at a level above the substrates and below the top electrodes for introducing process gases into the spaces over the substrates respectively, provided that gas flow rates of the sets of gas introduction ports are independently controlled. At least a process gas discharge nozzle is provided at a bottom portion of the chamber and having one end connected to the bottom portion of the chamber. A pressure adjusting section is provided at an intermediate portion of the process gas discharge nozzle for adjusting a pressure of the process gas within the chamber. A pressure reducing section is provided at the opposite end of the process gas discharge nozzle for reducing the pressure of the process gas within the chamber. The same number of dielectric plates, as the top electrodes, are provided over the top electrodes, the dielectric plates are positioned to make pairs with the top electrodes so that the dielectric plates are positioned over every the substrates. Microwave guides are coupled to the dielectric plates for transmitting microwaves through the dielectric plates separately and radiating microwaves via the microwave radiation ports toward the substrates individually to excite process gasses introduced and generate plasma gases. A high frequency voltage applying section is electrically connected to at least any of the top and bottom electrodes for applying individual high frequency voltages independently to a plurality of pairs of the top and bottom electrodes where voltage levels and frequencies of the individual high frequency voltages are independently controlled.

BRIEF DESCRIPTIONS OF THE DRAWINGS

Preferred embodiments according to the present invention will be described in detail with reference to the accompanying drawings.

DISCLOSURE OF THE INVENTION

The present invention provides an apparatus for a batch processing of a plurality of substrates at a time with plasma gas. The above chamber comprises the following elements. A chamber is provided for a batch processing of a plurality of substrates at a time with plasma gas. A plurality of sampling stages are accommodated within the chamber. The sampling stages are spaced apart from each other. Bottom electrodes are provided on the plurality of sampling stages. The bottom electrodes are spaced apart from each other so that substrates are placed on the bottom electrodes. The same number of top electrodes, as the bottom electrodes, are provided over a space which is positioned over the substrates. The top electrodes are positioned to make pairs with the bottom electrodes so that the substrates are positioned between the top and bottom electrodes paired respectively. Each of the top electrodes is divided into a plurality of parts separated from each other by microwave radiation ports through which microwave radiates toward the substrates. A process gas introduction section is provided on the chamber at a level above the substrates and below the top electrodes for introducing a process gas to the space over the substrates. A process gas discharging section is provided on the chamber for discharging the process gas from the chamber. A microwave radiation section is provided over the top electrodes for radiating microwaves toward the substrates via the microwave radiation ports to excite process gasses introduced by the process gas introducing section and generate plasma gases. A high frequency voltage applying section is provided to be electrically connected to at least any of the top and bottom electrodes for applying high frequency voltages between the top and bottom electrodes at high frequencies to accelerate plasma gases for processing the substrates.

It may be available that the chamber has a substantially rectangular parallelepiped shape. It may also be available that the sampling stages are arranged in matrix at the same level.

It may also be available that the high frequency voltage applying section comprises the same number of power supplies as the sampling stages, the power supplies being provided outside the chamber and being electrically connected to the bottom electrodes through walls of the chamber.

It may also be available that the microwave radiation ports varies in opening area over positions so that intensity of microwave radiation is uniform over positions.

It may also be available that the top electrodes are provided on a bottom surface of a ceramic plane plate extending in a horizontal plane.

It may also be available that the top electrodes are separated from each other by an insulator provided on the bottom surface of the ceramic plane plate.

It may also be available that the process gas discharging section is provided at a bottom portion of the chamber. In this case, the process gas discharging section may optionally comprises at least a process gas discharge nozzle having one end connected to the bottom portion of the chamber, a pressure adjusting section being provided at an intermediate portion of the process gas discharge nozzle for adjusting a pressure of the process gas within the chamber, and a pressure reducing section being provided at the opposite end of the process gas discharge nozzle for reducing the pressure of the process gas within the chamber. In this case, the process gas discharge nozzle may optionally has a cylindrical shape. The process gas pressure adjusting section may further optionally comprise a variable conductance valve, and the process gas pressure reducing section may further optionally comprise a vacuum pump.

It may be available that the process gas discharging section has the same number of process gas discharge nozzles as the sampling stages. The process gas discharge nozzles are integrated at the opposite end into a single nozzle. A plurality of variable conductance valves are provided for every the process gas discharge nozzles.

It may also be available that the process gas discharge nozzle extends from the bottom portion of the chamber in a downward direction.

It may also be available that the microwave radiating section may advantageously comprise the same number of dielectric plates, as the top electrodes, being provided over the top electrodes, wherein the dielectric plates are positioned to make pairs with the top electrodes so that the dielectric plates are positioned over every the substrates, and microwave guides being coupled to the dielectric plates for transmitting microwaves through the dielectric plates separately and radiating microwaves via the microwave radiation ports toward the substrates individually. In this case, the dielectric plates may be made of Teflon. In this case, it may be available to further provide a ceramic plate which extends under the dielectric plates and over the top electrodes, where the ceramic plate has a thickness which is sufficiently smaller for allowing microwaves to penetrate the ceramic plate. In this case, it may be available to further provide separation plates between the dielectric plates to separate the dielectric plates from each other.

It may be available that the microwave radiation ports vary in opening area over positions so that the microwaves radiate uniformly over positions.

It may be available that the high frequency applying section is capable of applying individual high frequency voltages independently to a plurality of pairs of the top and bottom electrodes where voltage levels and frequencies of the individual high frequency voltages are independently controlled. In this case, the high frequency applying section may advantageously comprise the same number of high frequency power supplies, as the bottom electrodes, being electrically connected to the bottom electrodes respectively and the high frequency power supplies are provided outside of the chamber.

It may be available to further provide isolation plates which extend from between the sampling stages to between the top electrodes so as to isolate spaces over the substrates and under the top electrodes.

It may be available that the process gas introducing section includes the same number of sets of gas introduction ports for introducing process gases into the spaces over the substrates respectively, provided that gas flow rates of the sets of gas introduction ports are independently controlled. In this case, the sets of gas introduction ports may optionally be provided in walls of the chamber. In this case, the sets of gas introduction ports may further be arranged laterally at a constant pitch.

It may also be available that the sets of gas introduction ports are provided in the top electrodes.

It may also be available that the sets of gas introduction ports are provided both in the top electrodes and walls of the chamber.

It may also be available to further provide isolation plates which extend from between the sampling stages to between the top electrodes so as to isolate spaces over the substrates and under the top electrodes, wherein the sets of gas introduction ports are provided both in the isolation plates and walls of the chamber.

It may also be available to further provide isolation plates which extend from between the sampling stages to between the top electrodes so as to isolate spaces over the substrates and under the top electrodes, wherein the sets of gas introduction ports are provided both in the top electrodes and the isolation plates.

It may also be available to further provide isolation plates which extend from between the sampling stages to between the top electrodes so as to isolate spaces over the substrates and under the top electrodes, wherein the sets of gas introduction ports are provided in the top electrodes, walls of the chamber and the isolation plates.

It may also be available to further provide magnets around the chamber for applying a time-constant magnetic field to the space within the chamber to reduce variations in density of the plasma gas.

It may also be available to further provide the same number of haters as the sampling stages for hating the substrates independently so that temperatures of the substrates are controlled independently.

It may also be available to further provide a lateral meshed plate being provided between the sampling plates and the chamber for confining the plasma gases within the spaces over the substrates, wherein the lateral meshed plate has pores which prevent the plasma gases from passing through the pores.

The present invention also provides another apparatus for a batch processing of a plurality of substrates at a time with plasma gas. The apparatus comprises the following elements. A chamber is provided for a batch processing of a plurality of substrates at a time with plasma gas. A plurality of sampling stages are accommodated within the chamber. The sampling stages are spaced apart from each other. Bottom electrodes are provided on the plurality of sampling stages. The bottom electrodes are spaced apart from each other so that substrates are placed on the bottom electrodes. The same number of top electrodes, as the bottom electrodes, are provided over a space which is positioned over the substrates. The top electrodes are positioned to make pairs with the bottom electrodes so that the substrates are positioned between the top and bottom electrodes paired respectively. Each of the top electrodes is divided into a plurality of parts separated from each other by microwave radiation ports through which microwave radiates toward the substrates. The microwave radiation ports vary in opening area over positions so that intensity of microwave radiation is uniform over positions. The same number of sets of gas introduction ports are provided on the chamber at a level above the substrates and below the top electrodes for introducing process gases into the spaces over the substrates respectively, provided that gas flow rates of the sets of gas introduction ports are independently controlled. At least a process gas discharge nozzle is provided at a bottom portion of the chamber and having one end connected to the bottom portion of the chamber. A pressure adjusting section is provided at an intermediate portion of the process gas discharge nozzle for adjusting a pressure of the process gas within the chamber. A pressure reducing section is provided at the opposite end of the process gas discharge nozzle for reducing the pressure of the process gas within the chamber. The same number of dielectric plates, as the top electrodes, are provided over the top electrodes, the dielectric plates are positioned to make pairs with the top electrodes so that the dielectric plates are positioned over every the substrates. Microwave guides are coupled to the dielectric plates for transmitting microwaves through the dielectric plates separately and radiating microwaves via the microwave radiation ports toward the substrates individually to excite process gasses introduced and generate plasma gases. A high frequency voltage applying section is electrically connected to at least any of the top and bottom electrodes for applying individual high frequency voltages independently to a plurality of pairs of the top and bottom electrodes where voltage levels and frequencies of the individual high frequency voltages are independently controlled.

It may be available that the chamber has a substantially rectangular parallelepiped shape. It may also be available that the sampling stages are arranged in matrix at the same level.

It may also be available that the high frequency voltage applying section comprises the same number of power supplies as the sampling stages, wherein the power supplies are provided outside the chamber and being electrically connected to the bottom electrodes through walls of the chamber.

It may also be available that the top electrodes are provided on a bottom surface of a ceramic plane plate extending in a horizontal plane.

It may also be available that the top electrodes are separated from each other by an insulator provided on the bottom surface of the ceramic plane plate.

It may also be available that the process gas discharge nozzle has a cylindrical shape.

It may also be available that the process gas pressure adjusting section comprises a variable conductance valve, and that the process gas pressure reducing section comprises a vacuum pump.

It may also be available that the process gas discharging section has the same number of process gas discharge nozzles as the sampling stages, wherein the process gas discharge nozzles are integrated at the opposite end into a single nozzle, and further available that a plurality of variable conductance valves are provided for every the process gas discharge nozzles.

It may also be available that the dielectric plates are made of Teflon.

It may also be available to further provide a ceramic plate which extends under the dielectric plates and over the top electrodes, where the ceramic plate has a thickness which is sufficiently smaller for allowing microwaves to penetrate the ceramic plate.

It may also be available to further provide separation plates between the dielectric plates which separate the dielectric plates from each other.

It may also be available that the high frequency voltage applying section comprises the same number of high frequency power supplies, as the bottom electrodes, being electrically connected to the bottom electrodes respectively, and that the high frequency power supplies are provided outside of the chamber.

It may also be available to further provide isolation plates which extend from between the sampling stages to between the top electrodes so as to isolate spaces over the substrates and under the top electrodes.

It may also be available that the sets of gas introduction ports are provided in walls of the chamber.

It may also be available that the sets of gas introduction ports are provided both in walls of the chamber and in the isolation plates.

It may also be available that the sets of gas introduction ports are provided in the top electrodes.

It may also be available that the sets of gas introduction ports are provided both in the top electrodes and walls of the chamber.

It may also be available that the sets of gas introduction ports are provided both in the top electrodes and the isolation plates.

It may also be available that the sets of gas introduction ports are provided in the top electrodes, walls of the chamber and the isolation plates.

It may also be available to further provide magnets around the chamber for applying a time-constant magnetic field to the space within the chamber to reduce variations in density of the plasma gas.

It may also be available to further provide the same number of haters as the sampling stages for hating the substrates independently so that temperatures of the substrates are controlled independently.

It may also be available to further provide a lateral meshed plate between the sampling plates and the chamber for confining the plasma gases within the spaces over the substrates, wherein the lateral meshed plate has pores which prevent the plasma gases from passing through the pores.

EMBODIMENTS

Figure 2A:
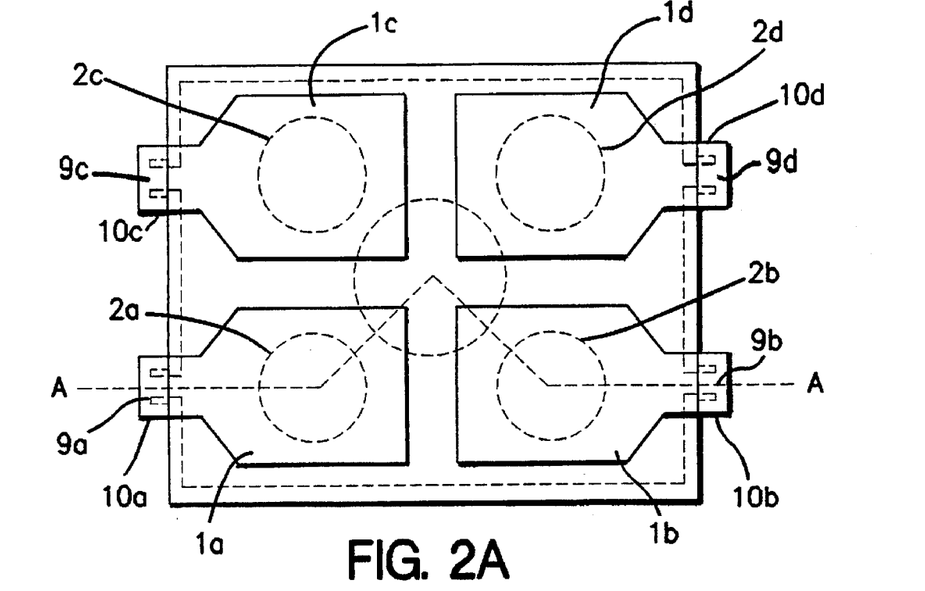
FIG. 2A is a plane view illustrative of a novel plane parallel plate plasma processing apparatus for batch processing of a plurality of substrates or wafers at one time in a first embodiment according to the present invention.
Figure 2B:
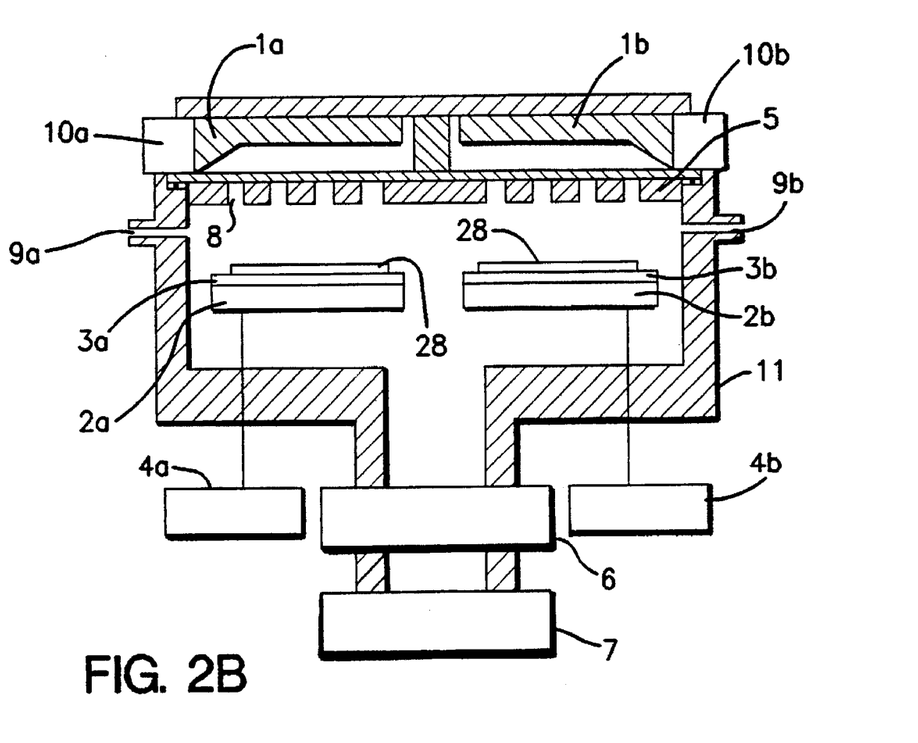
FIG. 2B is a cross sectional elevation view illustrative of a novel parallel plate plasma processing apparatus for batch processing of a plurality of substrates or wafers at one time in a first embodiment according to the present invention.

A first embodiment according to the present invention will be described in detail with reference to FIGS. 2A and 2B, wherein a plane parallel plate plasma processing apparatus is adjusted for a batch processing of four substrates or wafers at a time under a uniform condition or individually desirable conditions different from each other. The plane parallel plate plasma processing apparatus has a chamber 11 of a substantially rectangular parallelepiped shape adjusted for accommodating four sampling stages 2a, 2b, 2c and 2d which are arranged in matrix at the same level so that the individual sampling stages 2a, 2b, 2c and 2d are spaced apart from each other. Four bottom electrodes 3a, 3b, 3c and 3d are provided on the four sampling stages 2a, 2b, 2c and 2d so that the four bottom electrodes 3a, 3b, 3c and 3d are also spaced apart from each other. Four substrates or wafers 28 to be processed are placed on the four bottom electrodes 3a, 3b, 3c and 3d. The above four sets of the sampling stages 2a, 2b, 2c and 2d, the bottom electrodes 3a, 3b, 3c and 3d, and the substrates or wafers 28 to be processed are accommodated in the chamber 11. Four high frequency power supplies 4a, 4b, 4c and 4d are provided outside the chamber 11 but which are electrically connected through walls of the chamber 11 to the four sampling stages 2a, 2b, 2c and 2d respectively. The four sampling stages 2a, 2b, 2c and 2d are, as descried above, in contact with the four bottom electrodes 3a, 3b, 3c and 3d so that the four sampling stages 2a, 2b, 2c and 2d are further electrically connected with the four bottom electrodes 3a, 3b, 3c and 3d. Accordingly, the four bottom electrodes 3a, 3b, 3c and 3d are electrically connected to the four high frequency power supplies 4a, 4b, 4c and 4d respectively. Since the four high frequency power supplies 4a, 4b, 4c and 4d are controllable separately, it is possible to separately control high frequency powers applied to the four bottom electrodes 3a, 3b, 3c and 3d.

The bottom of the chamber 11 is provided with a large discharge nozzle which extends from the bottom wall of the substantially rectangular parallelepiped shape chamber 11 in the downward direction. The large discharge nozzle is provided at its intermediate portion with a pressure adjuster 6 for adjusting the pressure of the process gas in the chamber 11. The bottom end of the large discharge nozzle is provided with a vacuum pump 7 for reducing the process gas pressure in the chamber 11. The pressure of the process gas in the chamber 11 is set at a desirable value in cooperation with the vacuum pump 7 and the pressure adjuster 6. The process gas pressure set at the desirable value is kept by the function of the pressure adjuster 6.

Four gas introduction ports 9a, 9b, 9c and 9d are provided on a side wall of the chamber 11 for introducing the process gases into the chamber 11. The four gas introduction ports 9a, 9b, 9c and 9d are positioned above the substrates or the wafers 28 to be processed.

The upper portion of the chamber 11 has a microwave radiation portion which is adjusted for radiating the microwave toward the substrates or the wafers to be processed in the chamber 11. The microwave radiation portion includes four top electrodes 5, each of which is divided into a plurality of parts separated from each other through microwave radiation ports 8. The four top electrodes 5 are positioned over the four bottom electrodes 3a, 3b, 3c and 3d so that the four top electrodes 5 face to the four corresponding bottom electrodes 3a, 3b, 3c and 3d. The microwave radiation ports 8 varies in opening areas over positions so that the intensity of the microwave radiation is uniform over positions. The top electrodes 5 are provided on a bottom surface of a ceramic plane plate extending in a horizontal plane. The four top electrodes 5 are separated from each other by a first separator provided on the bottom surface of the ceramic plane plate. Four dielectric plane plates 1a, 1b, 1c and 1d made of Teflon are provided over the ceramic plane plate so that the four dielectric plane plates 1a, 1b, 1c and 1d face to the corresponding four top electrodes 5. Each of the four dielectric plane plates 1a, 1b, 1c and 1d has a substantially rectangular shape. The four dielectric plane plates 1a, 1b, 1c and 1d are connected with four microwave guides 10a, 10b, 10c and 10d which extend from the side wall of the chamber 11 in the outward directions. The four dielectric plane plates 1a, 1b, 1c and 1d are covered by a top wall of the chamber 11. The four dielectric plane plates 1a, 1b, 1c and 1d are separated from each other by a second separator. The four dielectric plane plates 1a, 1b, 1c and 1d are spaced apart from the ceramic plane plate. Microwaves are separately transmitted via the microwave guides 10a, 10b, 10c, and 10d to the dielectric plane plates 1a, 1b, 1c and 1d. The microwaves are penetrated through the ceramic plane plate and then radiated from the microwave radiation ports 8 between the top electrodes 5 toward the substrates or the wafers 28. The microwaves radiated uniformly from the microwave radiation cause excitations of the process gas to generate plasma gas. The generated plasma gas is accelerated by the high frequency electric field caused by the high frequency power voltages between the top and bottom electrodes 5, 3a, 3b, 3c, and 3d. The accelerated plasma is irradiated onto the substrates or the wafers 28.

Further, magnets may optionally be provided around the chamber 11 so that variations in density of the plasma gas is within ±4%.

Each of the gas introduction ports 9a, 9b, 9c and 9d comprises a gas supplying apparatus, a mass flow controller and a pipe arrangement so as to supply the desirable amount of process gas to the space between the top electrode 5 and the substrates or the wafers 28. Four of the gas introduction ports 9a, 9b, 9c and 9d are provided to independently control the flow rate of the injection process gases. The pressure adjuster 6 may optionally comprise a variable conductance valve to control the pressure in the range of 10–100 Pa which is in the viscosity flow range to thereby suppress a large variation in pressure of the process gas over positions.

Further, four heaters may optionally be provided within the four sampling stages 2a, 2b, 2c and 2d so as to independently control temperatures of the four substrates or the wafers 28.

As described above, the plane parallel plate plasma processing apparatus with the single chamber 11 are adjusted to independently control, for every substrates or wafers 28, the process gas pressures, the intensity of the microwave radiation, the temperature of the substrates or wafers, and the high frequency voltages applied between the top and bottom electrodes to thereby allow a batch process of a plurality of the substrates or the wafers at a time under a uniform condition or individually desirable conditions.

Figure 3A:
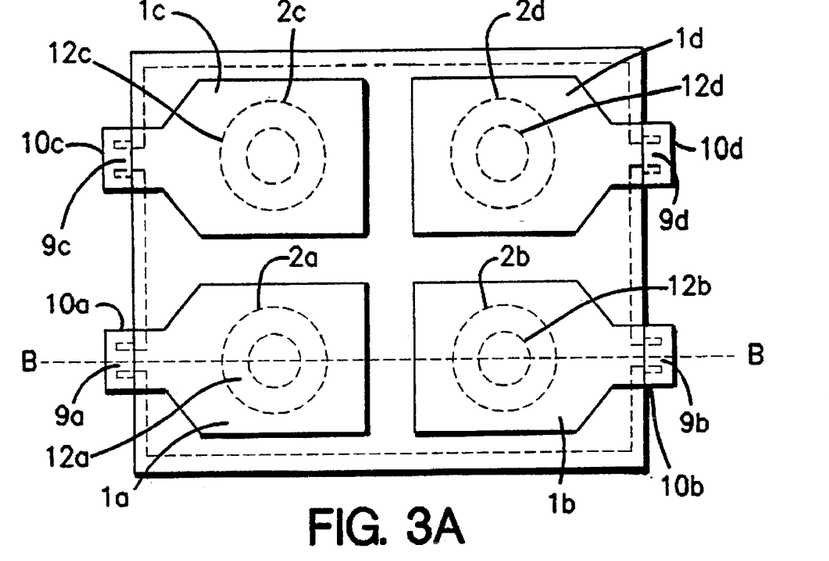
FIG. 3A is a plane view illustrative of a novel plane parallel plate plasma processing apparatus for batch processing of a plurality of substrates or wafers at one time in a second embodiment according to the present invention.
Figure 3B:
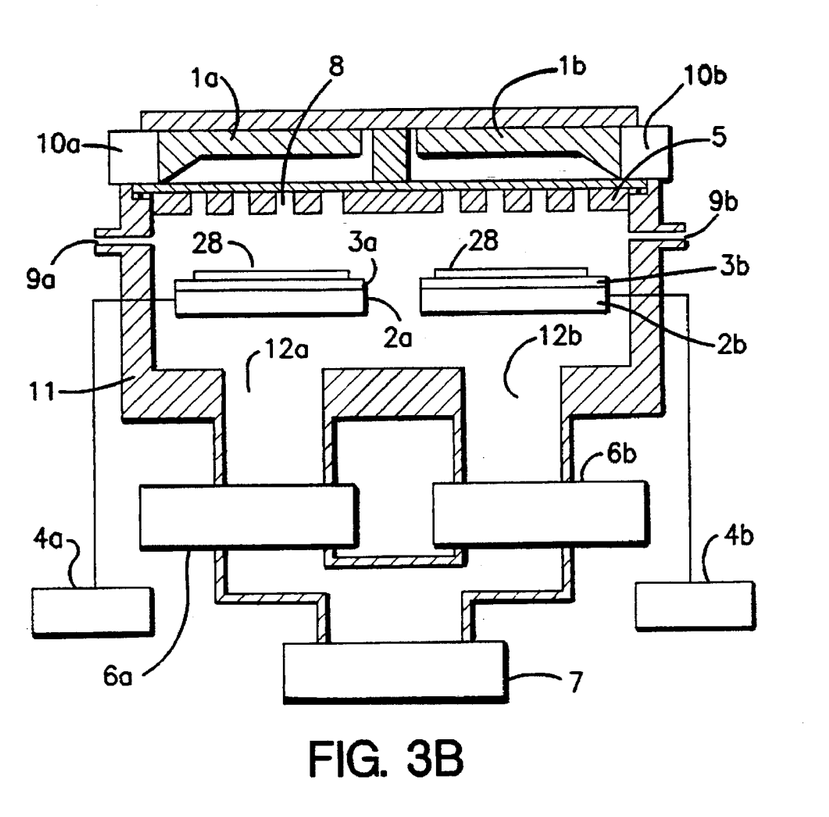
FIG. 3B is a cross sectional elevation view illustrative of a novel parallel plate plasma processing apparatus for batch processing of a plurality of substrates or wafers at one time in a second embodiment according to the present invention.

A second embodiment according to the present invention will be described in detail with reference to FIGS. 3A and 3B, wherein a plane parallel plate plasma processing apparatus is adjusted for a batch processing of four substrates or wafers at a time under a uniform condition or individually desirable conditions different from each other. The plane parallel plate plasma processing apparatus has a chamber 11 of a substantially rectangular parallelepiped shape adjusted for accommodating four sampling stages 2a, 2b, 2c and 2d which are arranged in matrix at the same level so that the individual sampling stages 2a, 2b, 2c and 2d are spaced apart from each other. Four bottom electrodes 3a, 3b, 3c and 3d are provided on the four sampling stages 2a, 2b, 2c and 2d so that the four bottom electrodes 3a, 3b, 3c and 3d are also spaced apart from each other. Four substrates or wafers 28 to be processed are placed on the four bottom electrodes 3a, 3b, 3c and 3d. The above four sets of the sampling stages 2a, 2b, 2c and 2d, the bottom electrodes 3a, 3b, 3c and 3d, and the substrates or wafers 28 to be processed are accommodated in the chamber 11. Four high frequency power supplies 4a, 4b, 4c and 4d are provided outside the chamber 11 but which are electrically connected through walls of the chamber 11 to the four sampling stages 2a, 2b, 2c and 2d respectively. The four sampling stages 2a, 2b, 2c and 2d are, as descried above, in contact with the four bottom electrodes 3a, 3b, 3c and 3d so that the four sampling stages 2a, 2b, 2c and 2d are further electrically connected with the four bottom electrodes 3a, 3b, 3c and 3d. Accordingly, the four bottom electrodes 3a, 3b, 3c and 3d are electrically connected to the four high frequency power supplies 4a, 4b, 4c and 4d respectively. Since the four high frequency power supplies 4a, 4b, 4c and 4d are controllable separately, it is possible to separately control high frequency powers applied to the four bottom electrodes 3a, 3b, 3c and 3d.

The bottom of the chamber 11 is provided with four large discharge nozzles 12a, 12b, 12c and 12d which extend from the bottom wall of the substantially rectangular parallelepiped shape chamber 11 in the downward direction. The four large discharge nozzles 12a, 12b, 12c and 12d are provided with four pressure adjusters 6a, 6b, 6c and 6d for adjusting the pressure of the process gas in the chamber 11. The bottom end of the four large discharge nozzles 12a, 12b, 12c and 12d are integrated into a single large discharge nozzle. The single large nozzle is provided with a single vacuum pump 7 for reducing the process gas pressure in the chamber 11. The pressure of the process gas in the chamber 11 is controlled by the four pressure adjusters 6a, 6b, 6c and 6d independently. As compared to the first embodiment, a larger conductance can be obtained, which remains constant, so that almost zero pressure difference over positions is generated even when the gas pressure reaches the molecular flow range. The four pressure adjusters 6a, 6b, 6c and 6d allow a precise pressure adjustment in the range of 0.01 Pa 100 Pa with almost no pressure variation over the position.

Four gas introduction ports 9a, 9b, 9c and 9d are provided on a side wall of the chamber 11 for introducing the process gases into the chamber 11. The four gas introduction ports 9a, 9b, 9c and 9d are positioned above the substrates or the wafers 28 to be processed.

The upper portion of the chamber 11 has a microwave radiation portion which is adjusted for radiating the microwave toward the substrates or the wafers to be processed in the chamber 11. The microwave radiation portion includes four top electrodes 5, each of which is divided into a plurality of parts separated from each other through microwave radiation ports 8. The four top electrodes 5 are positioned over the four bottom electrodes 3a, 3b, 3c and 3d so that the four top electrodes 5 face to the four corresponding bottom electrodes 3a, 3b, 3c and 3d. The microwave radiation ports 8 varies in opening area over positions so that the intensity of the microwave radiation remains uniform over positions. The top electrodes 5 are provided on a bottom surface of a ceramic plane plate extending in a horizontal plane. The four top electrodes 5 are separated from each other by a first separator provided on the bottom surface of the ceramic plane plate. Four dielectric plane plates 1a, 1b, 1c and 1d made of Teflon are provided over the ceramic plane plate so that the four dielectric plane plates 1a, 1b, 1c and 1d face to the corresponding four top electrodes 5. Each of the four dielectric plane plates 1a, 1b, 1c and 1d has a substantially rectangular shape. The four dielectric plane plates 1a, 1b, 1c and 1d are connected with four microwave guides 10a, 10b, 10c and 10d which extend from the side wall of the chamber 11 in the outward directions. The four dielectric plane plates 1a, 1b, 1c and 1d are covered by a top wall of the chamber 11. The four dielectric plane plates 1a, 1b, 1c and 1d are separated from each other by a second separator. The four dielectric plane plates 1a, 1b, 1c and 1d are spaced apart from the ceramic plane plate. Microwaves are separately transmitted via the microwave guides 10a, 10b, 10c, and 10d to the dielectric plane plates 1a, 1b, 1c and 1d. The microwaves are penetrated through the ceramic plane plate and then radiated from the microwave radiation ports 8 between the top electrodes 5 toward the substrates or the wafers 28. The microwaves radiated uniformly from the microwave radiation cause excitations of the process gas to generate plasma gas. The generated plasma gas is accelerated by the high frequency electric field caused by the high frequency power voltages between the top and bottom electrodes 5, 3a, 3b, 3c, and 3d. The accelerated plasma is irradiated onto the substrates or the wafers 28.

Further, magnets may optionally be provided around the chamber 11 so that variations in density of the plasma gas is within ±4%.

Each of the gas introduction ports 9a, 9b, 9c and 9d comprises a gas supplying apparatus, a mass flow controller and a pipe arrangement so as to supply the desirable amount of process gas to the space between the top electrode 5 and the substrates or the wafers 28. Four of the gas introduction ports 9a, 9b, 9c and 9d are provided to independently control the flow rate of the injection process gases. The pressure adjuster 6 may optionally comprise a variable conductance valve to control the pressure in the range of 10–100 Pa which is in the viscosity flow range to thereby suppress a large variation in pressure of the process gas over positions.

Further, four heaters may optionally be provided within the four sampling stages 2a, 2b, 2c and 2d so as to independently control temperatures of the four substrates or the wafers 28.

As described above, the plane parallel plate plasma processing apparatus with the single chamber 11 are adjusted to independently control, for every substrates or wafers 28, the process gas pressures, the intensity of the microwave radiation, the temperature of the substrates or wafers, and the high frequency voltages applied between the top and bottom electrodes to thereby allow a batch process of a plurality of the substrates or the wafers at a time under a uniform condition or individually desirable conditions. As compared to the first embodiment, a larger conductance can be obtained, which remains constant, so that almost zero pressure difference over positions is generated even when the gas pressure reaches the molecular flow range. The four pressure adjusters 6a, 6b, 6c and 6d allow a precise pressure adjustment in the range of 0.01 Pa 100 Pa with almost no pressure variation over the position.

Figure 4A:
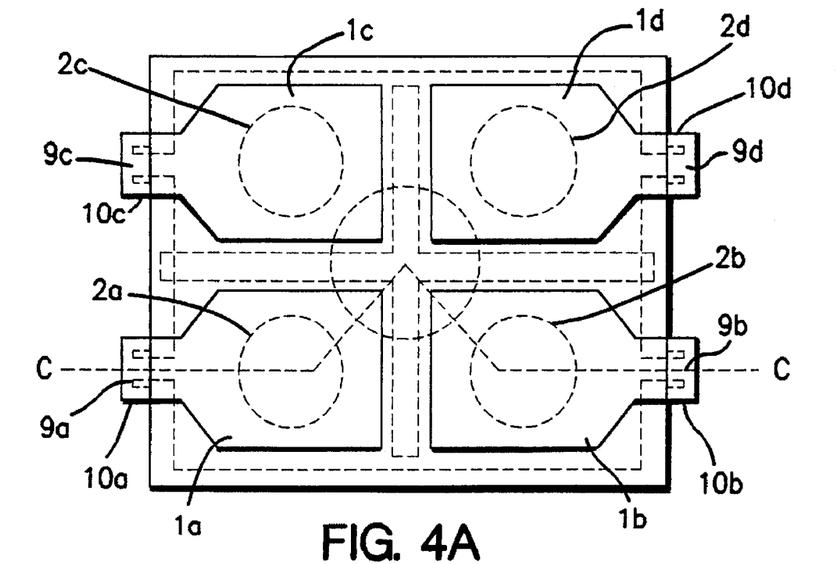
FIG. 4A is a plane view illustrative of a novel plane parallel plate plasma processing apparatus for batch processing of a plurality of substrates or wafers at one time in a third embodiment according to the present invention.
Figure 4B:
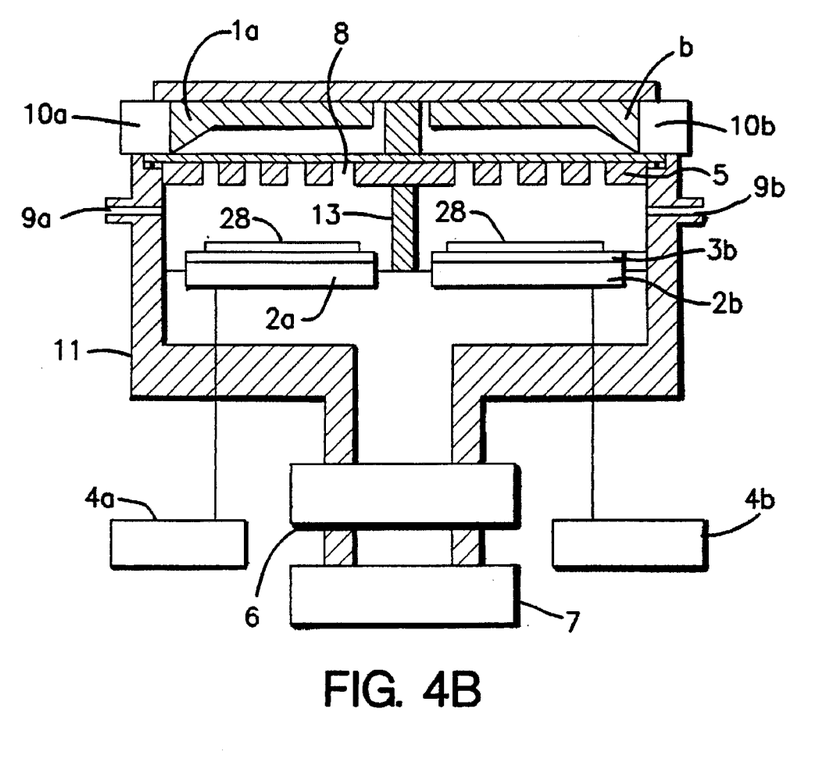
FIG. 4B is a cross sectional elevation view illustrative of a novel parallel plate plasma processing apparatus for batch processing of a plurality of substrates or wafers at one time in a third embodiment according to the present invention.

A third embodiment according to the present invention will be described in detail with reference to FIGS. 4A and 4B, wherein a plane parallel plate plasma processing apparatus is adjusted for a batch processing of four substrates or wafers at a time under a uniform condition or individually desirable conditions different from each other. The plane parallel plate plasma processing apparatus has a chamber 11 of a substantially rectangular parallelepiped shape adjusted for accommodating four sampling stages 2a, 2b, 2c and 2d which are arranged in matrix at the same level so that the individual sampling stages 2a, 2b, 2c and 2d are spaced apart from each other. Four bottom electrodes 3a, 3b, 3c and 3d are provided on the four sampling stages 2a, 2b, 2c and 2d so that the four bottom electrodes 3a, 3b, 3c and 3d are also spaced apart from each other. Four substrates or wafers 28 to be processed are placed on the four bottom electrodes 3a, 3b, 3c and 3d. The above four sets of the sampling stages 2a, 2b, 2c and 2d, the bottom electrodes 3a, 3b, 3c and 3d, and the substrates or wafers 28 to be processed are accommodated in the chamber 11. Four high frequency power supplies 4a, 4b, 4c and 4d are provided outside the chamber 11 but which are electrically connected through walls of the chamber 11 to the four sampling stages 2a, 2b, 2c and 2d respectively. The four sampling stages 2a, 2b, 2c and 2d are, as descried above, in contact with the four bottom electrodes 3a, 3b, 3c and 3d so that the four sampling stages 2a, 2b, 2c and 2d are further electrically connected with the four bottom electrodes 3a, 3b, 3c and 3d. Accordingly, the four bottom electrodes 3a, 3b, 3c and 3d are electrically connected to the four high frequency power supplies 4a, 4b, 4c and 4d respectively. Since the four high frequency power supplies 4a, 4b, 4c and 4d are controllable separately, it is possible to separately control high frequency powers applied to the four bottom electrodes 3a, 3b, 3c and 3d.

The bottom of the chamber 11 is provided with a large discharge nozzle which extends from the bottom wall of the substantially rectangular parallelepiped shape chamber 11 in the downward direction. The large discharge nozzle is provided at its intermediate portion with a pressure adjuster 6 for adjusting the pressure of the process gas in the chamber 11. The bottom end of the large discharge nozzle is provided with a vacuum pump 7 for reducing the process gas pressure in the chamber 11. The pressure of the process gas in the chamber 11 is set at a desirable value in cooperation with the vacuum pump 7 and the pressure adjuster 6. The process gas pressure set at the desirable value is kept by the function of the pressure adjuster 6.

Four gas introduction ports 9a, 9b, 9c and 9d are provided on a side wall of the chamber 11 for introducing the process gases into the chamber 11. The four gas introduction ports 9a, 9b, 9c and 9d are positioned above the substrates or the wafers 28 to be processed.

The upper portion of the chamber 11 has a microwave radiation portion which is adjusted for radiating the microwave toward the substrates or the wafers to be processed in the chamber 11. The microwave radiation portion includes four top electrodes 5, each of which is divided into a plurality of parts separated from each other through microwave radiation ports 8. The four top electrodes 5 are positioned over the four bottom electrodes 3a, 3b, 3c and 3d so that the four top electrodes 5 face to the four corresponding bottom electrodes 3a, 3b, 3c and 3d. The microwave radiation ports 8 varies in opening areas over positions so that the intensity of the microwave radiation is uniform over positions. The top electrodes 5 are provided on a bottom surface of a ceramic plane plate extending in a horizontal plane. The four top electrodes 5 are separated from each other by a first separator provided on the bottom surface of the ceramic plane plate. Four dielectric plane plates 1a, 1b, 1c and 1d made of Teflon are provided over the ceramic plane plate so that the four dielectric plane plates 1a, 1b, 1c and 1d face to the corresponding four top electrodes 5. Each of the four dielectric plane plates 1a, 1b, 1c and 1d has a substantially rectangular shape. The four dielectric plane plates 1a, 1b, 1c and 1d are connected with four microwave guides 10a, 10b, 10c and 10d which extend from the side wall of the chamber 11 in the outward directions. The four dielectric plane plates 1a, 1b, 1c and 1d are covered by a top wall of the chamber 11. The four dielectric plane plates 1a, 1b, 1c and 1d are separated from each other by a second separator. The four dielectric plane plates 1a, 1b, 1c and 1d are spaced apart from the ceramic plane plate. Microwaves are separately transmitted via the microwave guides 10a, 10b, 10c, and 10d to the dielectric plane plates 1a, 1b, 1c and 1d. The microwaves are penetrated through the ceramic plane plate and then radiated from the microwave radiation ports 8 between the top electrodes 5 toward the substrates or the wafers 28. The microwaves radiated uniformly from the microwave radiation cause excitations of the process gas to generate plasma gas. The generated plasma gas is accelerated by the high frequency electric field caused by the high frequency power voltages between the top and bottom electrodes 5, 3a, 3b, 3c, and 3d. The accelerated plasma is irradiated onto the substrates or the wafers 28.

A lateral meshed plate is provided between the sampling plates and the chamber for confining the plasma gases within the spaces over the substrates 28, wherein the lateral meshed plate has pores which prevent the plasma gases from passing through the pores.

Further, isolation plates 13 are provided which extend in a vertical direction from between the sampling stages 2a, 2b, 2c and 2d to between the four top electrodes 5 in order to isolate spaces over the four substrates or the wafers 28. As a result, the four sets of the sampling stages 2a, 2b, 2c and 2d, the bottom electrodes 3a, 3b, 3c and 3d, and the substrates or wafers 28 to be processed are isolated via the isolation plates 13 from each other. The isolation plates 13 are made of an electrically conductive material. The above isolation plates 13 for isolating the spaces over the substrates or the wafers 28 prevent any interference between plasmas generated in those spaces. Even if the gas pressure is relatively high, the above isolation plates 13 for isolating the spaces over the substrates or the wafers 28 is capable of preventing unnecessary diffusion of the plasma gas to the peripheral portions of the chamber 11 to thereby prevent bad influences to the substrates or the wafers 28.

Furthermore, magnets may optionally be provided around the chamber 11 so that variations in density of the plasma gas is within ±4%.

Each of the gas introduction ports 9a, 9b, 9c and 9d comprises a gas supplying apparatus, a mass flow controller and a pipe arrangement so as to supply the desirable amount of process gas to the space between the top electrode 5 and the substrates or the wafers 28. Four of the gas introduction ports 9a, 9b, 9c and 9d are provided to independently control the flow rate of the injection process gases. The pressure adjuster 6 may optionally comprise a variable conductance valve to control the pressure in the range of 10–100 Pa which is in the viscosity flow range to thereby suppress a large variation in pressure of the process gas over positions.

Further, four heaters may optionally be provided within the four sampling stages 2a, 2b, 2c and 2d so as to independently control temperatures of the four substrates or the wafers 28.

As described above, the plane parallel plate plasma processing apparatus with the single chamber 11 are adjusted to independently control, for every substrates or wafers 28, the process gas pressures, the intensity of the microwave radiation, the temperature of the substrates or wafers, and the high frequency voltages applied between the top and bottom electrodes to thereby allow a batch process of a plurality of the substrates or the wafers at a time under a uniform condition or individually desirable conditions. The above isolation plates 13 for isolating the spaces over the substrates or the wafers 28 prevent any interference between plasmas generated in those spaces. Even if the gas pressure is relatively high, the above isolation plates 13 for isolating the spaces over the substrates or the wafers 28 is capable of preventing unnecessary diffusion of the plasma gas to the peripheral portions of the chamber 11 to thereby prevent bad influences to the substrates or the wafers 28.

Figure 5A:
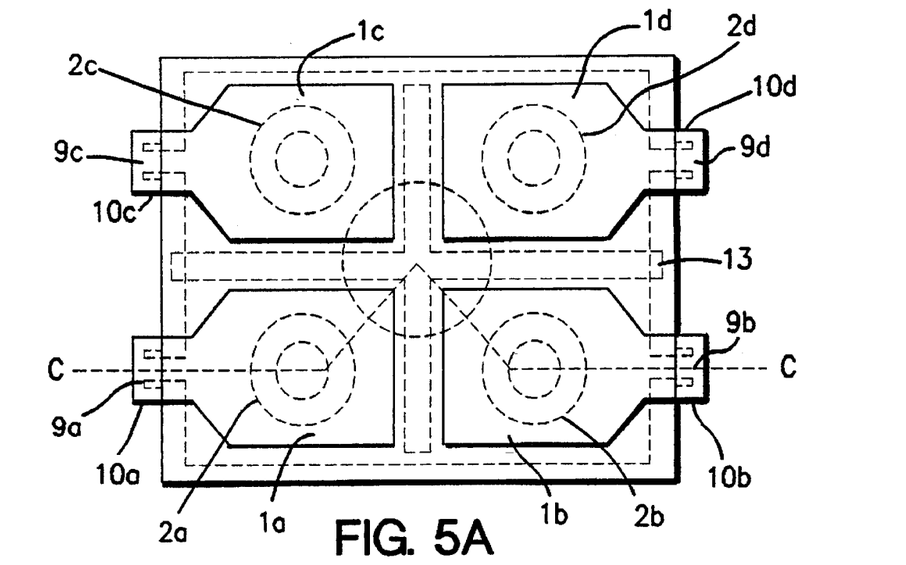
FIG. 5A is a plane view illustrative of a novel plane parallel plate plasma processing apparatus for batch processing of a plurality of substrates or wafers at one time in a fourth embodiment according to the present invention.
Figure 5B:
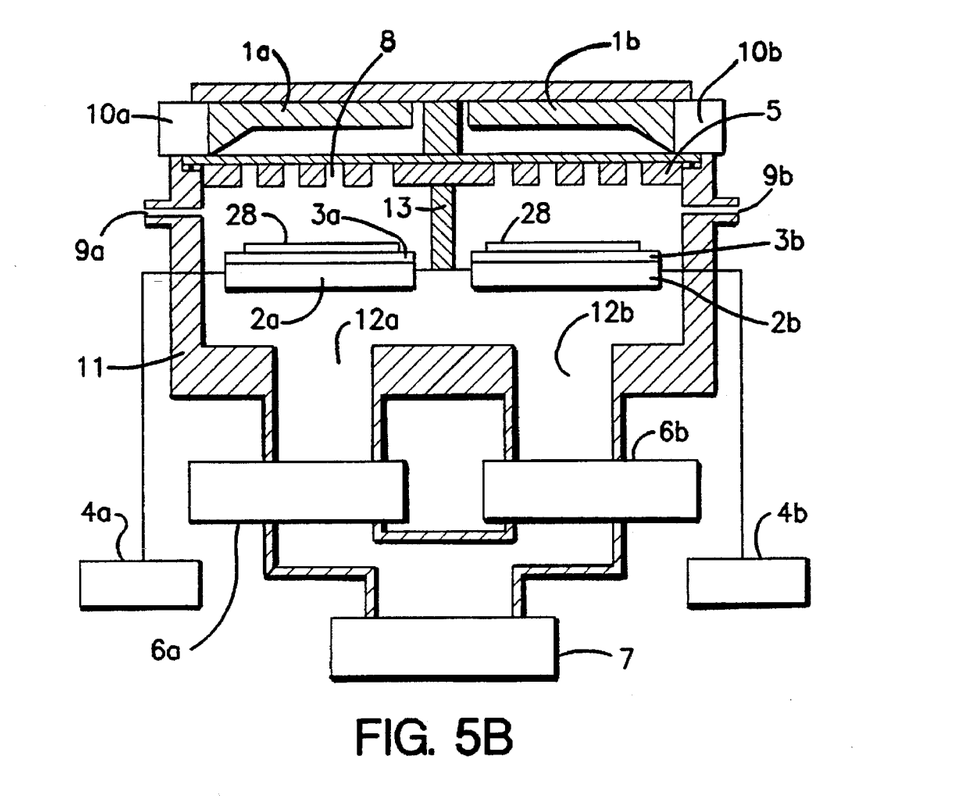
FIG. 5B is a cross sectional elevation view illustrative of a novel parallel plate plasma processing apparatus for batch processing of a plurality of substrates or wafers at one time in a fourth embodiment according to the present invention.

A fourth embodiment according to the present invention will be described in detail with reference to FIGS. 5A and 5B, wherein a plane parallel plate plasma processing apparatus is adjusted for a batch processing of four substrates or wafers at a time under a uniform condition or individually desirable conditions different from each other. The plane parallel plate plasma processing apparatus has a chamber 11 of a substantially rectangular parallelepiped shape adjusted for accommodating four sampling stages 2a, 2b, 2c and 2d which are arranged in matrix at the same level so that the individual sampling stages 2a, 2b, 2c and 2d are spaced apart from each other. Four bottom electrodes 3a, 3b, 3c and 3d are provided on the four sampling stages 2a, 2b, 2c and 2d so that the four bottom electrodes 3a, 3b, 3c and 3d are also spaced apart from each other. Four substrates or wafers 28 to be processed are placed on the four bottom electrodes 3a, 3b, 3c and 3d. The above four sets of the sampling stages 2a, 2b, 2c and 2d, the bottom electrodes 3a, 3b, 3c and 3d, and the substrates or wafers 28 to be processed are accommodated in the chamber 11. Four high frequency power supplies 4a, 4b, 4c and 4d are provided outside the chamber 11 but which are electrically connected through walls of the chamber 11 to the four sampling stages 2a, 2b, 2c and 2d respectively. The four sampling stages 2a, 2b, 2c and 2d are, as descried above, in contact with the four bottom electrodes 3a, 3b, 3c and 3d so that the four sampling stages 2a, 2b, 2c and 2d are further electrically connected with the four bottom electrodes 3a, 3b, 3c and 3d. Accordingly, the four bottom electrodes 3a, 3b, 3c and 3d are electrically connected to the four high frequency power supplies 4a, 4b, 4c and 4d respectively. Since the four high frequency power supplies 4a, 4b, 4c and 4d are controllable separately, it is possible to separately control high frequency powers applied to the four bottom electrodes 3a, 3b, 3c and 3d.

The bottom of the chamber 11 is provided with four large discharge nozzles 12a, 12b, 12c and 12d which extend from the bottom wall of the substantially rectangular parallelepiped shape chamber 11 in the downward direction. The four large discharge nozzles 12a, 12b, 12c and 12d are provided with four pressure adjusters 6a, 6b, 6c and 6d for adjusting the pressure of the process gas in the chamber 11. The bottom end of the four large discharge nozzles 12a, 12b, 12c and 12d are integrated into a single large discharge nozzle. The single large nozzle is provided with a single vacuum pump 7 for reducing the process gas pressure in the chamber 11. The pressure of the process gas in the chamber 11 is controlled by the four pressure adjusters 6a, 6b, 6c and 6d independently. As compared to the first embodiment, a larger conductance can be obtained, which remains constant, so that almost zero pressure difference over positions is generated even when the gas pressure reaches the molecular flow range. The four pressure adjusters 6a, 6b, 6c and 6d allow a precise pressure adjustment in the range of 0.01 Pa 100 Pa with almost no pressure variation over the position.

Four gas introduction ports 9a, 9b, 9c and 9d are provided on a side wall of the chamber 11 for introducing the process gases into the chamber 11. The four gas introduction ports 9a, 9b, 9c and 9d are positioned above the substrates or the wafers 28 to be processed.

The upper portion of the chamber 11 has a microwave radiation portion which is adjusted for radiating the microwave toward the substrates or the wafers to be processed in the chamber 11. The microwave radiation portion includes four top electrodes 5, each of which is divided into a plurality of parts separated from each other through microwave radiation ports 8. The four top electrodes 5 are positioned over the four bottom electrodes 3a, 3b, 3c and 3d so that the four top electrodes 5 face to the four corresponding bottom electrodes 3a, 3b, 3c and 3d. The microwave radiation ports 8 varies in opening area over positions so that the intensity of the microwave radiation remains uniform over positions. The top electrodes 5 are provided on a bottom surface of a ceramic plane plate extending in a horizontal plane. The four top electrodes 5 are separated from each other by a first separator provided on the bottom surface of the ceramic plane plate. Four dielectric plane plates 1a, 1b, 1c and 1d made of Teflon are provided over the ceramic plane plate so that the four dielectric plane plates 1a, 1b, 1c and 1d face to the corresponding four top electrodes 5. Each of the four dielectric plane plates 1a, 1b, 1c and 1d has a substantially rectangular shape. The four dielectric plane plates 1a, 1b, 1c and 1d are connected with four microwave guides 10a, 10b, 10c and 10d which extend from the side wall of the chamber 11 in the outward directions. The four dielectric plane plates 1a, 1b, 1c and 1d are covered by a top wall of the chamber 11. The four dielectric plane plates 1a, 1b, 1c and 1d are separated from each other by a second separator. The four dielectric plane plates 1a, 1b, 1c and 1d are spaced apart from the ceramic plane plate. Microwaves are separately transmitted via the microwave guides 10a, 10b, 10c, and 10d to the dielectric plane plates 1a, 1b, 1c and 1d. The microwaves are penetrated through the ceramic plane plate and then radiated from the microwave radiation ports 8 between the top electrodes 5 toward the substrates or the wafers 28. The microwaves radiated uniformly from the microwave radiation cause excitations of the process gas to generate plasma gas. The generated plasma gas is accelerated by the high frequency electric field caused by the high frequency power voltages between the top and bottom electrodes 5, 3a, 3b, 3c, and 3d. The accelerated plasma is irradiated onto the substrates or the wafers 28.

A lateral meshed plate is provided between the sampling plates and the chamber for confining the plasma gases within the spaces over the substrates 28, wherein the lateral meshed plate has pores which prevent the plasma gases from passing through the pores.

Further, isolation plates 13 are provided which extend in a vertical direction from between the sampling stages 2a, 2b, 2c and 2d to between the four top electrodes 5 in order to isolate spaces over the four substrates or the wafers 28. As a result, the four sets of the sampling stages 2a, 2b, 2c and 2d, the bottom electrodes 3a, 3b, 3c and 3d, and the substrates or wafers 28 to be processed are isolated via the isolation plates 13 from each other. The isolation plates 13 are made of an electrically conductive material. The above isolation plates 13 for isolating the spaces over the substrates or the wafers 28 prevent any interference between plasmas generated in those spaces. Even if the gas pressure is relatively high, the above isolation plates 13 for isolating the spaces over the substrates or the wafers 28 is capable of preventing unnecessary diffusion of the plasma gas to the peripheral portions of the chamber 11 to thereby prevent bad influences to the substrates or the wafers 28.

Furthermore, magnets may optionally be provided around the chamber 11 so that variations in density of the plasma gas is within ±4%.

Each of the gas introduction ports 9a, 9b, 9c and 9d comprises a gas supplying apparatus, a mass flow controller and a pipe arrangement so as to supply the desirable amount of process gas to the space between the top electrode 5 and the substrates or the wafers 28. Four of the gas introduction ports 9a, 9b, 9c and 9d are provided to independently control the flow rate of the injection process gases. The pressure adjuster 6 may optionally comprise a variable conductance valve to control the pressure in the range of 10–100 Pa which is in the viscosity flow range to thereby suppress a large variation in pressure of the process gas over positions.

Further, four heaters may optionally be provided within the four sampling stages 2a, 2b, 2c and 2d so as to independently control temperatures of the four substrates or the wafers 28.

As described above, the plane parallel plate plasma processing apparatus with the single chamber 11 are adjusted to independently control, for every substrates or wafers 28, the process gas pressures, the intensity of the microwave radiation, the temperature of the substrates or wafers, and the high frequency voltages applied between the top and bottom electrodes to thereby allow a batch process of a plurality of the substrates or the wafers at a time under a uniform condition or individually desirable conditions different from each other. As compared to the first embodiment, a larger conductance can be obtained, which remains constant, so that almost zero pressure difference over positions is generated even when the gas pressure reaches the molecular flow range. The four pressure adjusters 6a, 6b, 6c and 6d allow a precise pressure adjustment in the range of 0.01 Pa 100 Pa with almost no pressure variation over the position. The above isolation plates 13 for isolating the spaces over the substrates or the wafers 28 prevent any interference between plasmas generated in those spaces. Even if the gas pressure is relatively high, the above isolation plates 13 for isolating the spaces over the substrates or the wafers 28 is capable of preventing unnecessary diffusion of the plasma gas to the peripheral portions of the chamber 11 to thereby prevent bad influences to the substrates or the wafers 28.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims any modifications which fall within the spirit and scope of the present invention.

What is claimed is:

1. An apparatus for a batch processing of a plurality of substrates at a time with plasma gas, comprising:

a chamber;

a plurality of sampling stages accommodated within said chamber, said sampling stages being spaced apart from each other;

bottom electrodes being provided on said plurality of sampling stages, said bottom electrodes being spaced apart from each other, so that substrates are placed on said bottom electrodes;

the same number of top electrodes, as said bottom electrodes, being provided over a space which is positioned over said substrates, said top electrodes being positioned to make pairs with said bottom electrodes so that said substrates are positioned between said top and bottom electrodes paired respectively, each of said top electrodes being divided into a plurality of parts separated from each other by microwave radiation ports through which microwave radiates toward said substrates;

means being provided on said chamber at a level above said substrates and below said top electrodes for introducing a process gas to said space over said substrates;

means being provided on said chamber for discharging said process gas from said chamber;

means being provided over said top electrodes for radiating microwaves toward said substrates via said microwave radiation ports to excite process gasses introduced by said process gas introducing means and generate plasma gases; and means being electrically connected to at least any of said top and bottom electrodes for applying high frequency voltages between said top and bottom electrodes at high frequencies to accelerate plasma gases for processing said substrates.

2. The apparatus as claimed in claim 1, wherein said chamber has a substantially rectangular parallelepiped shape.

3. The apparatus as claimed in claim 1, wherein said sampling stages are arranged in matrix at the same level.

4. The apparatus as claimed in claim 1, wherein said means for applying high frequency voltages comprises the same number of power supplies as said sampling stages, said power supplies being provided outside said chamber and being electrically connected to said bottom electrodes through walls of the chamber.

5. The apparatus as claimed in claim 1, wherein said microwave radiation ports varies in opening area over positions so that intensity of microwave radiation is uniform over positions.

6. The apparatus as claimed in claim 1, wherein said top electrodes are provided on a bottom surface of a ceramic plane plate extending in a horizontal plane.

7. The apparatus as claimed in claim 1, wherein said top electrodes are separated from each other by an insulator provided on the bottom surface of the ceramic plane plate.

8. The apparatus as claimed in claim 1, wherein said process gas discharging means is provided at a bottom portion of said chamber.

9. The apparatus as claimed in claim 8, wherein said process gas discharging means comprises:

at least a process gas discharge nozzle having one end connected to said bottom portion of said chamber;

means being provided at an intermediate portion of said process gas discharge nozzle for adjusting a pressure of said process gas within said chamber; and means being provided at the opposite end of said process gas discharge nozzle for reducing said pressure of said process gas within said chamber.

10. The apparatus as claimed in claim 9, wherein said process gas discharge nozzle has a cylindrical shape.

11. The apparatus as claimed in claim 9, wherein said process gas pressure adjusting means comprises a variable conductance valve; and wherein said process gas pressure reducing means comprises a vacuum pump.

12. The apparatus as claimed in claim 8,
wherein said process gas discharging means has the same number of process gas discharge nozzles as said sampling stages, said process gas discharge nozzles being integrated at said opposite end into a single nozzle; and
wherein a plurality of variable conductance valves are provided for every said process gas discharge nozzles.

13. The apparatus as claimed in claim 8, wherein said process gas discharge nozzle extends from said bottom portion of said chamber in a downward direction.

14. The apparatus as claimed in claim 1, wherein said means for radiating microwaves comprises:
the same number of dielectric plates, as said top electrodes, being provided over said top electrodes, said dielectric plates are positioned to make pairs with said top electrodes so that said dielectric plates are positioned over every said substrates; and
microwave guides being coupled to said dielectric plates for transmitting microwaves through said dielectric plates separately and radiating microwaves via said microwave radiation ports toward said substrates individually.

15. The apparatus as claimed in claim 14, wherein said dielectric plates are made of Teflon.

16. The apparatus as claimed in claim 14, further comprising a ceramic plate provided to extend under said dielectric plates and over said top electrodes, where said ceramic plate has a thickness which is sufficiently smaller for allowing microwaves to penetrate said ceramic plate.

17. The apparatus as claimed in claim 14, further comprising separation plates between said dielectric plates to separate said dielectric plates from each other.

18. The apparatus as claimed in claim 1, wherein said microwave radiation ports vary in opening area over positions so that said microwaves radiate uniformly over positions.

19. The apparatus as claimed in claim 1, wherein said high frequency voltage applying means is capable of applying individual high frequency voltages independently to a plurality of pairs of said top and bottom electrodes where voltage levels and frequencies of said individual high frequency voltages are independently controlled.

20. The apparatus as claimed in claim 19, wherein said high frequency voltage applying means comprises the same number of high frequency power supplies, as said bottom electrodes, being electrically connected to said bottom electrodes respectively and said high frequency power supplies are provided outside of said chamber.

21. The apparatus as claimed in claim 1, further comprising isolation plates being provided to extend from between said sampling stages to between said top electrodes so as to isolate spaces over said substrates and under said top electrodes.

22. The apparatus as claimed in claim 1, wherein said process gas introducing means includes the same number of sets of gas introduction ports for introducing process gases into said spaces over said substrates respectively, provided gas flow rates of said sets of gas introduction ports are independently controlled.

23. The apparatus as claimed in claim 22, wherein said sets of gas introduction ports are provided in walls of said chamber.

24. The apparatus as claimed in claim 23, wherein said sets of gas introduction ports are arranged laterally at a constant pitch.

25. The apparatus as claimed in claim 22, wherein said sets of gas introduction ports are provided in said top electrodes.

26. The apparatus as claimed in claim 22, wherein said sets of gas introduction ports are provided both in said top electrodes and walls of said chamber.

27. The apparatus as claimed in claim 22, further comprising isolation plates being provided to extend from between said sampling stages to between said top electrodes so as to isolate spaces over said substrates and under said top electrodes, wherein said sets of gas introduction ports are provided both in said isolation plates and walls of said chamber.

28. The apparatus as claimed in claim 1, further comprising isolation plates being provided to extend from between said sampling stages to between said top electrodes so as to isolate spaces over said substrates and under said top electrodes, wherein said sets of gas introduction ports are provided both in said top electrodes and said isolation plates.

29. The apparatus as claimed in claim 1, further comprising isolation plates being provided to extend from between said sampling stages to between said top electrodes so as to isolate spaces over said substrates and under said top electrodes, wherein said sets of gas introduction ports are provided in said top electrodes, walls of said chamber and said isolation plates.

30. The apparatus as claimed in claim 1, further comprising magnets provided around said chamber for applying a time-constant magnetic field to said space within said chamber to reduce variations in density of said plasma gas.

31. The apparatus as claimed in claim 1, further comprising the same number of heaters as said sampling stages for heating said substrates independently so that temperatures of said substrates are controlled independently.

32. The apparatus as claimed in claim 1, further comprising a lateral meshed plate being provided between said sampling plates and said chamber for confining said plasma gases within said spaces over said substrates, wherein said lateral meshed plate has pores which prevent said plasma gases from passing through said pores.

33. An apparatus for a batch processing of a plurality of substrates at a time with plasma gas, comprising:
a chamber;
a plurality of sampling stages accommodated within said chamber, said sampling stages being spaced apart from each other;
bottom electrodes being provided on said plurality of sampling stages, said bottom electrodes being spaced apart from each other, so that substrates are placed on said bottom electrodes;
the same number of top electrodes, as said bottom electrodes, being provided over a space which is positioned over said substrates, said top electrodes being positioned to make pairs with said bottom electrodes so that said substrates are positioned between said top and bottom electrodes paired respectively, each of said top electrodes being divided into a plurality of parts separated from each other by microwave radiation ports through which microwave radiates toward said substrates, said microwave radiation ports varying in opening area over positions so that intensity of microwave radiation is uniform over positions;
the same number of sets of gas introduction ports being provided on said chamber at a level above said substrates and below said top electrodes for introducing process gases into said spaces over said substrates respectively, provided gas flow rates of said sets of gas introduction ports are independently controlled;

at least a process gas discharge nozzle being provided at a bottom portion of said chamber and having one end connected to said bottom portion of said chamber;

means being provided at an intermediate portion of said process gas discharge nozzle for adjusting a pressure of said process gas within said chamber;

means being provided at the opposite end of said process gas discharge nozzle for reducing said pressure of said process gas within said chamber;

the same number of dielectric plates, as said top electrodes, being provided over said top electrodes, said dielectric plates are positioned to make pairs with said top electrodes so that said dielectric plates are positioned over every said substrates;

microwave guides being coupled to said dielectric plates for transmitting microwaves through said dielectric plates separately and radiating microwaves via said microwave radiation ports toward said substrates individually to excite process gasses introduced and generate plasma gases; and means being electrically connected to at least any of said top and bottom electrodes for applying individual high frequency voltages independently to a plurality of pairs of said top and bottom electrodes where voltage levels and frequencies of said individual high frequency voltages are independently controlled.

34. The apparatus as claimed in claim 33, wherein said chamber has a substantially rectangular parallelepiped shape.

35. The apparatus as claimed in claim 33, wherein said sampling stages are arranged in matrix at the same level.

36. The apparatus as claimed in claim 33, wherein said means for applying high frequency voltages comprises the same number of power supplies as said sampling stages, said power supplies being provided outside said chamber and being electrically connected to said bottom electrodes through walls of the chamber.

37. The apparatus as claimed in claim 33, wherein said top electrodes are provided on a bottom surface of a ceramic plane plate extending in a horizontal plane.

38. The apparatus as claimed in claim 33, wherein said top electrodes are separated from each other by an insulator provided on the bottom surface of the ceramic plane plate.

39. The apparatus as claimed in claim 33, wherein said process gas discharge nozzle has a cylindrical shape.

40. The apparatus as claimed in claim 33,
wherein said process gas pressure adjusting means comprises a variable conductance valve; and
wherein said process gas pressure reducing means comprises a vacuum pump.

41. The apparatus as claimed in claim 33, wherein said process gas discharging means has the same number of process gas discharge nozzles as said sampling stages, said process gas discharge nozzles being integrated at said opposite end into a single nozzle; and
wherein a plurality of variable conductance valves are provided for every said process gas discharge nozzles.

42. The apparatus as claimed in claim 33, wherein said dielectric plates are made of Teflon.

43. The apparatus as claimed in claim 33, further comprising a ceramic plate provided to extend under said dielectric plates and over said top electrodes, where said ceramic plate has a thickness which is sufficiently smaller for allowing microwaves to penetrate said ceramic plate.

44. The apparatus as claimed in claim 33, further comprising separation plates between said dielectric plates to separate said dielectric plates from each other.

45. The apparatus as claimed in claim 33, wherein said high frequency voltage applying means comprises the same number of high frequency power supplies, as said bottom electrodes, being electrically connected to said bottom electrodes respectively and said high frequency power supplies are provided outside of said chamber.

46. The apparatus as claimed in claim 33, further comprising isolation plates being provided to extend from between said sampling stages to between said top electrodes so as to isolate spaces over said substrates and under said top electrodes.

47. The apparatus as claimed in claim 33, wherein said sets of gas introduction ports are provided in walls of said chamber.

48. The apparatus as claimed in claim 46, wherein said sets of gas introduction ports are provided both in walls of said chamber and in said isolation plates.

49. The apparatus as claimed in claim 33, wherein said sets of gas introduction ports are provided in said top electrodes.

50. The apparatus as claimed in claim 33, wherein said sets of gas introduction ports are provided both in said top electrodes and walls of said chamber.

51. The apparatus as claimed in claim 46, wherein said sets of gas introduction ports are provided both in said top electrodes and said isolation plates.

52. The apparatus as claimed in claim 46, wherein said sets of gas introduction ports are provided in said top electrodes, walls of said chamber and said isolation plates.

53. The apparatus as claimed in claim 33, further comprising magnets provided around said chamber for applying a time-constant magnetic field to said space within said chamber to reduce variations in density of said plasma gas.

54. The apparatus as claimed in claim 33, further comprising the same number of haters as said sampling stages for hating said substrates independently so that temperatures of said substrates are controlled independently.

55. The apparatus as claimed in claim 33, further comprising a lateral meshed plate being provided between said sampling plates and said chamber for confining said plasma gases within said spaces over said substrates, wherein said lateral meshed plate has pores which prevent said plasma gases from passing through said pores.

* * * * *